United States Patent
Kuriyama

(10) Patent No.: US 7,422,925 B2
(45) Date of Patent: Sep. 9, 2008

(54) SOLID-STATE IMAGING APPARATUS AND MANUFACTURING METHOD THEREOF

(75) Inventor: Toshihiro Kuriyama, Otsu (JP)

(73) Assignee: Matsushita Electric Industrial Co. Ltd., Osaka (JP)

( * ) Notice: Subject to any disclaimer, the term of this patent is extended or adjusted under 35 U.S.C. 154(b) by 975 days.

(21) Appl. No.: 10/847,442

(22) Filed: May 18, 2004

(65) Prior Publication Data
US 2004/0233314 A1 Nov. 25, 2004

(30) Foreign Application Priority Data
May 20, 2003 (JP) ............... 2003-142201

(51) Int. Cl.
*H01L 21/00* (2006.01)
(52) U.S. Cl. .......................... 438/73; 438/75
(58) Field of Classification Search .............. 438/48, 438/57, 59, 60, 73, 74, 75–79
See application file for complete search history.

(56) References Cited
FOREIGN PATENT DOCUMENTS

| JP | 1-241863 | 9/1989 |
|---|---|---|
| JP | 7-74337 | 3/1995 |
| JP | 8-88344 | 4/1996 |
| JP | 2002-343955 | 11/2002 |

*Primary Examiner*—Savitri Mulpuri
(74) *Attorney, Agent, or Firm*—Wenderoth, Lind & Ponack, L.L.P.

(57) ABSTRACT

The present invention aims to provide a solid-state apparatus and a manufacturing method thereof, the solid-state apparatus having both high transfer efficiency in a horizontal transfer CCD and efficient breakdown voltage in a vertical transfer CCD and including a semiconductor substrate 110, first layer poly-silicon electrodes 120 and second layer poly-silicon electrodes 130 which form two layered overlap poly-silicon electrodes, an embedded channel region 140 which is formed in a surface unit of the semiconductor substrate 110 and becomes a transfer path for signal charge, and a photodiode region where photodiodes are aligned two-dimensionally, the photodiodes converting light into signal charge and accumulating the signal charge, wherein an inter-electrode distance c in the horizontal transfer CCD is shorter than an inter-electrode distance a in the vertical transfer CCD.

3 Claims, 5 Drawing Sheets

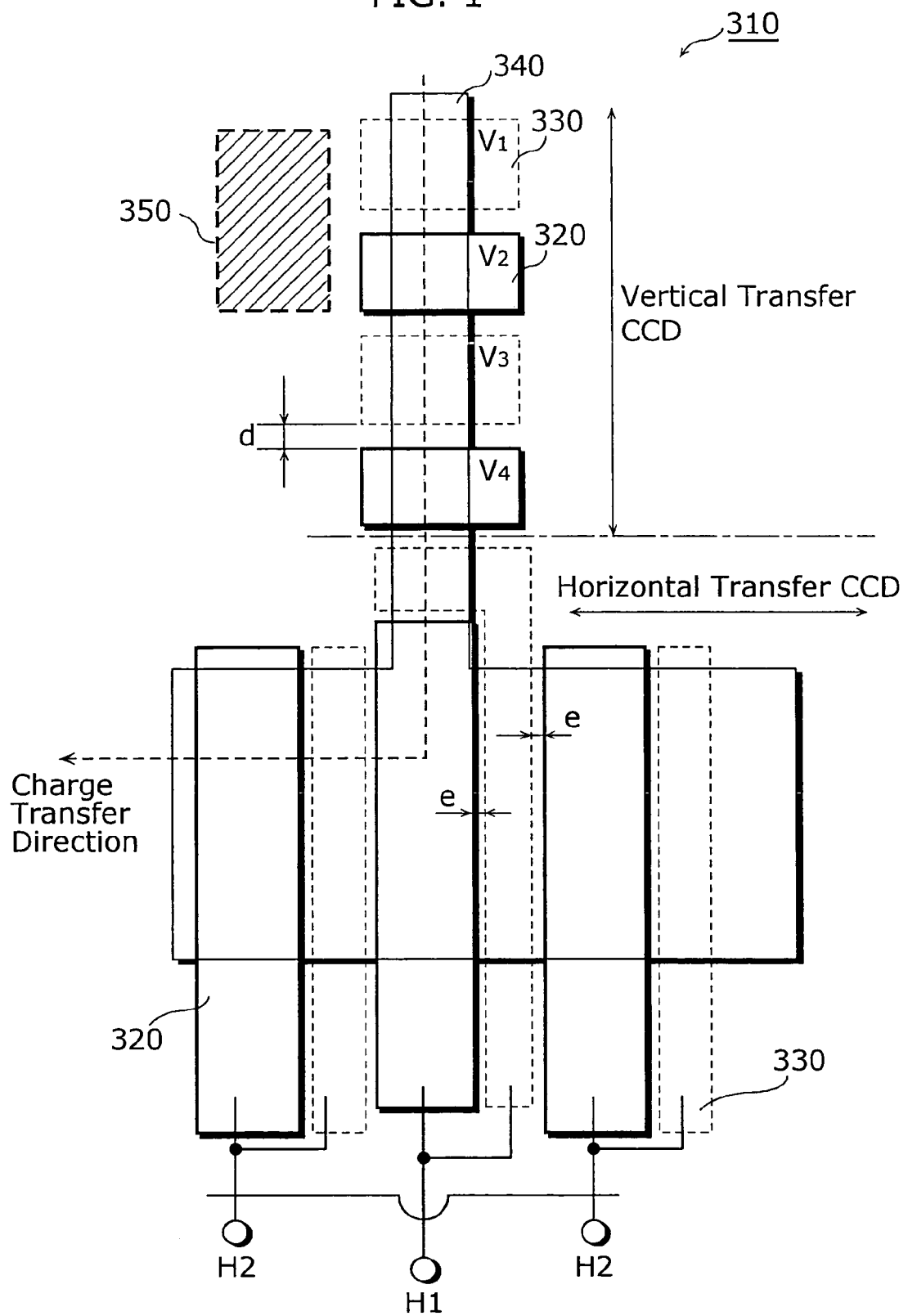

FIG. 5A
Cross-section Diagram(A-A')
Plane Diagram
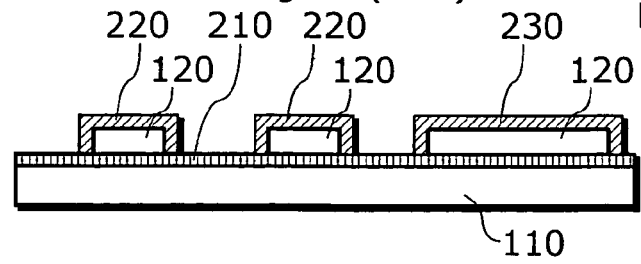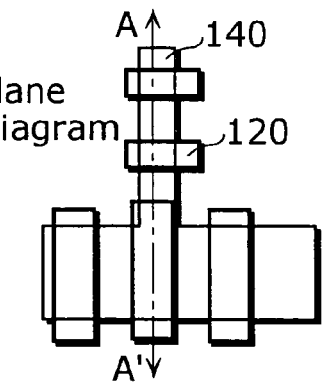
FIG. 5B
Cross-section Diagram(A-A')
Ion Implantation
Oxide Film Removal
Plane Diagram
Ion Implantation
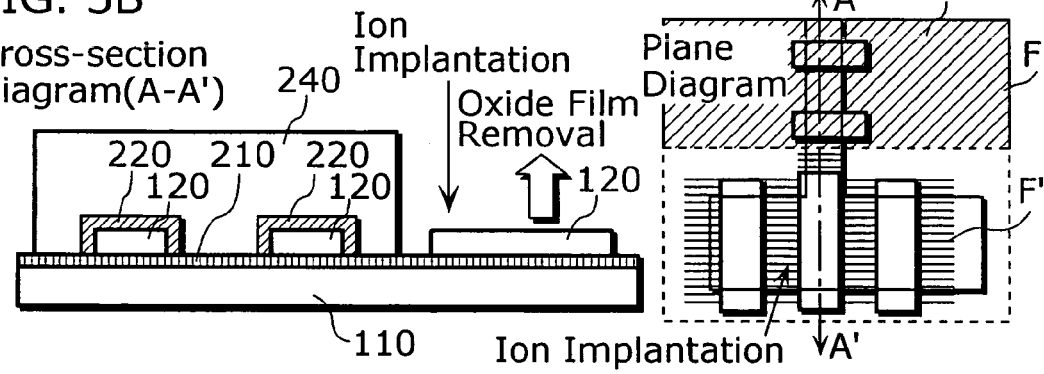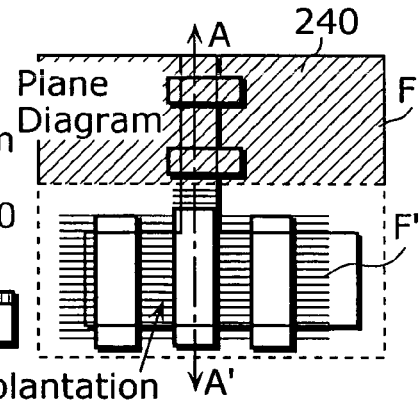
FIG. 5C
Cross-section Diagram(A-A')
Oxide Film Formation
Plane Diagram
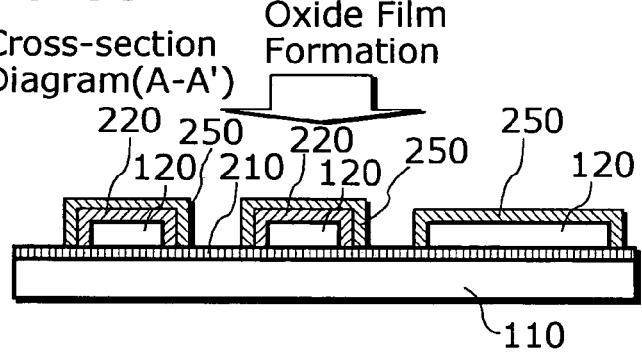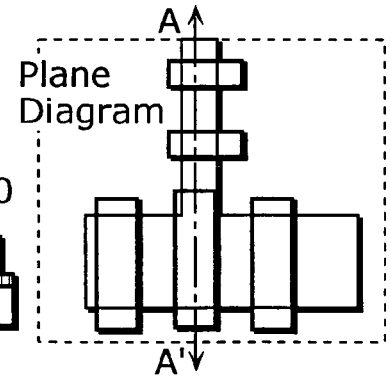
FIG. 5D
Cross-section Diagram(A-A')
Plane Diagram
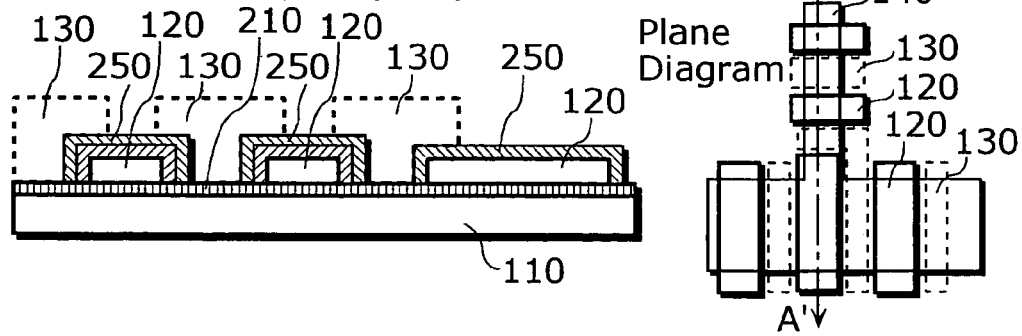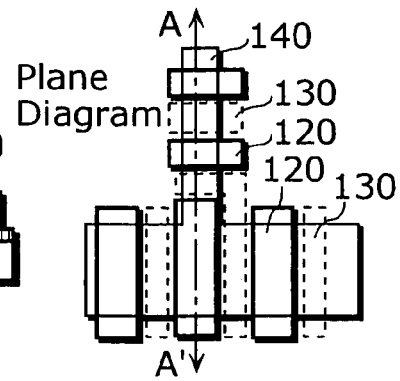

US 7,422,925 B2

SOLID-STATE IMAGING APPARATUS AND MANUFACTURING METHOD THEREOF

BACKGROUND OF THE INVENTION (1) Field of the Invention

The present invention relates to a solid-state imaging apparatus and a manufacturing method thereof.

(2) Description of the Prior Art

In recent years, as a solid-state imaging apparatus which forms a sensing apparatus of a camera, especially that of a digital camera, a CCD (Charge Coupled Device) type solid-state imaging apparatus is mainly used. Seeking further high efficiency such as higher image quality, longer time for use, higher speed of continuous-shooting, and lighter weight for the camera, it is necessary for the solid-state imaging apparatus to achieve high pixel density, lower electric power consumption, high speed, miniaturization and the like.

There are several problems to satisfy these requirements. Following problem occurs particularly when solid-state imaging apparatus with high pixel density having high CCD transfer efficiency is realized. An increase of the number of pixels causes an increase of the number of transfer stages, that is, a deterioration of transfer efficiency is caused. Therefore, a distance between transfer electrodes needs to be shortened to increase the transfer efficiency of the CCD. Further, it is difficult for a transfer electrode of horizontal transfer CCD to increase the transfer efficiency since it applies only low driving voltage with high driving frequency to reduce electric power consumption. Thus, shortening the distance between transfer electrodes is also necessary to increase the transfer efficiency of the horizontal transfer CCD. However, the distance between transfer electrodes is generally designed as long as a minimum length determined by lithography. Therefore, the transfer efficiency of CCD cannot be increased by shortening the distance between transfer electrodes than the minimum length determined by the lithography.

A prior art for solving these problems is a "solid-state imaging apparatus" (refer to Japanese Laid-Open Patent publication application No. 7-74337, pp. 16, FIG. 24). According to the prior art, a solid-state imaging apparatus shortens a distance between transfer electrodes and increases the transfer efficiency of CCD by making transfer electrodes to have two layered overlap poly-silicon structure.

FIG. 1 is a schematic plane diagram indicating an arrangement of transfer electrodes in a conventional solid-state imaging apparatus.

As shown in FIG. 1, a conventional solid-state imaging apparatus is comprised of a semiconductor substrate 310, a first layer poly-silicon electrode 320 and a second layer poly-silicon electrode 330 which form a two layered overlap poly-silicon electrode, an embedded channel region 340 which is formed in a surface unit of the semiconductor substrate 310 and becomes a transfer path for signal charge, and a photodiode region 350 aligned photodiodes which convert light into signal charge and accumulate the signal charge. Here calls a distance between transfer electrodes of vertical transfer CCD as d and a distance between transfer electrodes of horizontal transfer CCD as e. The horizontal transfer CCD is a two-phase-driving CCD which transfers charge by applying voltage with two different levels of H1 and H2. The vertical transfer CCD is a four-phase-driving CCD which transfers charge by applying voltage with four different levels of V1, V2, V3 and V4.

Next, a method of manufacturing a solid-state imaging apparatus which has the arrangement of transfer electrodes as above described is explained.

FIGS. 2 are a schematic plane diagram indicating the arrangement of transfer electrodes in a conventional solid-state imaging apparatus and a schematic cross-section diagram at A-A' line in the schematic plane diagram. In here, same components as in FIG. 1 are put with the same marks as in FIG. 1, and the detail explanations about those components are omitted.

First, as shown in FIG. 2A, the first layer poly-silicon electrodes 320 are formed on a gate insulation film 410 on the semiconductor substrate 310 and oxidized for forming first oxide films 420 to insulate between layers.

Next, as shown in FIG. 2B, the second layer poly-silicon electrodes 330 are formed between two adjoining first layer poly-silicon electrodes 320 on the gate insulation film 410.

Accordingly, in a conventional solid-state imaging apparatus, the distance between transfer electrodes of the vertical transfer CCD d and the distance between transfer electrodes of horizontal transfer CCD e are determined by thickness of the first oxide film 420 between the first layer poly-silicon electrode 320 and the second layer poly-silicon electrode 330. Therefore, the distance can be shortened than the minimum length determined by lithography.

Here, FIG. 3 explains that the transfer efficiency of CCD is increased as a distance between transfer electrodes is shortened.

FIG. 3 is a change diagram of potential distribution that explains a transfer of signal charge. FIG. 3 shows the potential distribution along the A-A' line on the plane diagram in FIG. 2. In the transfer of signal charge, respective potential of a first layer poly-silicon electrode 320a, a second layer poly-silicon electrode 330a, a first layer poly-silicon electrode 320b, and a second layer poly-silicon electrode 330b are φV1, φV2, φV3, and φV4.

In a time t1 when the potential φV1 and the potential φV2 are at high level, a region controlled by the first layer poly-silicon electrode 320a and the second layer poly-silicon electrode 330a have a deeper potential than a region controlled by the first layer poly-silicon electrode 320b and the second layer poly-silicon electrode 330b. Therefore, the signal charge is accumulated in the region controlled by the first layer poly-silicon electrode 320a, and the second layer poly-silicon electrode 330a.

In a time t2 when the potential φV3 is also at a high level, a region controlled by the first layer poly-silicon electrode 320a, the second layer poly-silicon electrode 330a and the first layer poly-silicon electrode 320b have a deeper potential than a region controlled by the second layer poly-silicon electrode 330b. Therefore, the signal charge is accumulated in the region controlled by the first layer poly-silicon electrode 320a, the second layer poly-silicon electrode 330a, and the first poly-silicon electrode 320b.

In a time t3 when the potential φV1 is at a low level, a region controlled by the second layer poly-silicon electrode 330a and the first layer poly-silicon electrode 320b have a deeper potential than a region controlled by the first poly-silicon electrode 320a and the second layer poly-silicon 330b. Then, the signal charge is accumulated in the region controlled by the second layer poly-silicon electrode 330a and the first layer poly-silicon electrode 320b. Thus, the signal charge is transferred from the region controlled by the first layer poly-silicon electrode 320a and the second layer poly-silicon electrode 330a to the region controlled by the second layer poly-silicon electrode 330a and the first layer poly-silicon electrode 320b. At this time, a potential pocket is formed between the region controlled by the first layer poly-silicon electrode 320a and the region controlled by the second poly-silicon electrode 330b. Some of signal charges are trapped in the potential pocket so that the signal charge is not transferred completely.

In the case where a distance between transfer electrodes is consistent, the formation of a potential pocket is determined by a difference of potentials under the adjoining electrodes and the potential pocket is formed when the difference of the potentials becomes smaller than the consistent value. Accordingly, in FIG. 3, the difference of the potentials under each electrode of potential at high level becomes smaller so that a potential pocket is formed under inter-transfer-electrodes. Also, the difference of the potentials under each transfer electrode of potential at low level becomes zero so that a potential pocket is formed. On the other hand, since the difference becomes larger between the potential under transfer electrode of potential at higher level and the potential under transfer electrode of potential at low level, a potential pocket is not formed.

In general, a size of a potential pocket is determined by the distance between transfer electrodes and the size becomes smaller as the distance gets shorter under an interaction of each electric field of transfer electrodes.

As above described, in a transfer of signal charge, a potential pocket is formed under inter-transfer-electrodes, the potential pocket being a cause of lowering the transfer efficiency of signal charge. Therefore, the transfer efficiency of CCD is increased by making the potential pocket smaller, that is, by making the distance between transfer electrodes shorter.

Note that, while FIG. 3 explains about the four-phase-driving CCD, the same thing as above described occurs in the two-phase-driving CCD used generally for a horizontal transfer CCD.

In a conventional solid-state imaging apparatus, higher driving voltage is applied to transfer electrodes of the vertical transfer CCD since the vertical transfer CCD not only transfers the signal charge but also reads out the signal charge from a photo receiver unit. Therefore, when the inter-transfer-electrodes distance d in the horizontal transfer CCD is shortened to increase the transfer efficiency, enough breakdown voltage between transfer electrodes cannot be obtained. Thus, when the inter-transfer electrodes distance e is shortened to increase the transfer efficiency, the inter-transfer-electrodes d in the vertical transfer CCD is shortened. It is because that the inter-transfer-electrodes distance d in the vertical transfer CCD equals to the inter-transfer-electrodes distance e in the horizontal transfer CCD since the vertical transfer CCD and the horizontal transfer CCD are formed by the same process. As the consequence, the breakdown voltage between transfer electrodes becomes insufficient.

SUMMARY OF THE INVENTION

Considering such problems, the present invention, aims to provide a solid-state imaging apparatus and the manufacturing method thereof especially according to a solid-state imaging apparatus with high pixel density formed of fine pixels, the solid-state imaging apparatus being able to be compatible with high transfer efficiency in the horizontal transfer CCD and efficient breakdown voltage in the vertical transfer CCD.

To achieve above objectives, the solid-state imaging apparatus according to the present invention transfers signal charge generated as a result of opto-electronic conversion of incident light, comprising: a plurality of opto-electronic conversion units arranged two dimensionally on a semiconductor substrate; a vertical transfer CCD that receives signal charge from the opto-electronic conversion units and transferring the signal charge in vertical direction; and a horizontal transfer CCD that receives the signal charge transferred from the vertical transfer CCD and transferring the signal charge in horizontal direction, wherein transfer electrodes of the vertical transfer CCD and the horizontal transfer CCD are respectively formed in a layer structure with two or more layers, and distance between adjacent transfer electrodes of the horizontal transfer CCD is shorter than a distance between adjacent transfer electrodes of the vertical transfer CCD. Here, the transfer electrodes of the vertical transfer CCD and the horizontal transfer CCD can be respectively formed in a two-layer structure.

Thus, the transfer electrodes of the vertical transfer CCD and the horizontal CCD are respectively formed in a layer structure with two or more layers. The distance between adjacent electrodes of the vertical transfer CCD is longer than that of the horizontal transfer CCD. Therefore, it is effective to realize a solid-state imaging apparatus that has a horizontal transfer CCD with high transfer efficiency and a vertical transfer CCD with efficient breakdown voltage.

Also, the distance between transfer electrodes of which the vertical transfer CCD is adjacent to the horizontal transfer CCD equals to the distance between adjacent transfer electrodes of the horizontal transfer CCD.

Accordingly, the distance between a transfer electrode of the vertical transfer CCD and a transfer electrode of the horizontal transfer CCD can be shortened. As the result, a solid-state imaging apparatus with the transfer efficiency of signal charges between the transfer electrode of the vertical transfer CCD and the transfer electrode of the horizontal transfer CCD is realized.

In addition, the two or more layered films are formed between adjacent transfer electrodes in the vertical transfer CCD, and one or more layered films are formed between adjacent transfer electrodes in the horizontal transfer CCD, and a total thickness of the films formed between adjacent transfer electrodes in the vertical transfer CCD is thicker than a total thickness of the films formed between adjacent transfer electrodes in the horizontal transfer CCD. Here, two layered films can be formed between adjacent transfer electrodes in the vertical transfer CCD and one layered film can be formed between adjacent transfer electrodes in the horizontal transfer CCD.

By controlling the total thickness of films formed between adjacent transfer electrodes of the vertical transfer CCD and that of films formed between adjacent transfer electrodes of the horizontal transfer CCD, the distance between adjacent transfer electrodes of the vertical transfer CCD can be longer than that of the horizontal transfer CCD.

Further, the total number of film layers formed between adjacent transfer electrodes in the vertical transfer CCD may be larger than a total number of film layers formed between adjacent transfer electrodes in the horizontal transfer CCD, and the films formed between adjacent transfer electrodes in the vertical transfer CCD may include a film that is as thick as the films formed between adjacent transfer electrodes in the horizontal transfer CCD.

Accordingly, by controlling a total thickness of films that are formed between adjacent transfer electrodes of the vertical transfer CCD and are not formed between adjacent transfer electrodes of the horizontal transfer CCD, the distance between transfer electrodes that is needed to obtain an efficient breakdown voltage in the vertical transfer CCD can be set.

The present invention can be also a manufacturing method of a solid-state imaging apparatus, comprising: a step of forming first transfer electrodes of a horizontal transfer CCD and a vertical transfer CCD on a semiconductor substrate; a step of forming a first oxide film over each of the first transfer electrodes; a step of selectively removing the first oxide films formed over the first transfer electrodes of the horizontal transfer CCD; a step of forming a second oxide film over each of the first transfer electrodes of the vertical transfer CCD and the horizontal transfer CCD; and a step of forming second transfer electrodes between the first transfer electrodes of the vertical transfer CCD and the horizontal transfer CCD. The manufacturing method of a solid-state imaging apparatus may also comprise: a step of forming first transfer electrodes of a vertical transfer CCD and a horizontal transfer CCD on a semiconductor substrate; a step of forming first oxide films over each of the first transfer electrodes; a step of opening a region that includes only the first transfer electrodes of the horizontal transfer CCD and forming a resist layer which covers all other regions; a step of selectively removing the first oxide films formed over the first transfer electrodes of the horizontal transfer CCD; a step of forming a potential barrier region by implanting ion between the first transfer electrodes of the horizontal transfer CCD; a step of removing said resist layer; a step of forming a second oxide film over each of the first transfer electrodes of the vertical transfer CCD and the horizontal transfer CCD; and a step of forming second transfer electrodes between the first transfer electrodes of the vertical transfer CCD and the horizontal transfer CCD. The first oxide films can be removed by wet etching.

As the result, the horizontal transfer CCD with high transfer efficiency and the vertical transfer CCD with efficient breakdown voltage are formed by a single process.

As is clear from the above explanation, the solid-state imaging apparatus according to the present invention can shorten the distance between adjacent electrodes of the horizontal transfer CCD than that of the vertical transfer CCD and can set appropriate distance between adjacent electrodes of both vertical and horizontal transfer CCD. Therefore, in addition to a transfer efficiency advancement and a tendency of low voltage at the time of high driving in the horizontal transfer, an improvement of FPN between a transfer electrode of the vertical transfer CCD and a transfer electrode of the horizontal transfer CCD, an increase of the saturation threshold of the amount of signal charges to be used, the present invention can realize an excellent solid-state imaging apparatus and the manufacturing method thereof that are capable of securing breakdown voltage in the vertical transfer. Furthermore, according to the solid-state imaging apparatus and the manufacturing method thereof in the present invention, the vertical transfer CCD and the horizontal transfer CCD are formed by a single process so that a high-efficient solid-state imaging apparatus can be easily produced.

Accordingly, the present invention provides a solid-state imaging apparatus with high pixel density and the manufacturing method thereof, the imaging apparatus with high pixel density having a horizontal transfer CCD with high transfer efficiency and a vertical transfer CCD with efficient breakdown voltage that are manufactured by a single process so that a picture taken by a camera achieves high picture quality and further, the consumption voltage of the camera is reduced. Therefore, the practical value of a solid-state imaging apparatus and the manufacturing method thereof is quite high.

As further information about the technical background to this application, the disclosure of Japanese Patent Application No. 2003-142201 filed on May 20, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 1 is a schematic plane diagram indicating an arrangement of transfer electrodes in a conventional solid-state imaging apparatus.

FIGS. 5A, 5B, 5C, and 5D are schematic plane diagrams and the schematic cross-section diagrams (schematic cross-section diagrams at A-A' line in the plane diagrams) indicating an arrangement of transfer electrodes in the solid-state imaging apparatus.

DESCRIPTION OF THE PREFERRED EMBODIMENT

Following explains about a solid-state imaging apparatus in an embodiment of the present invention with reference to figures.

Figure 2A:
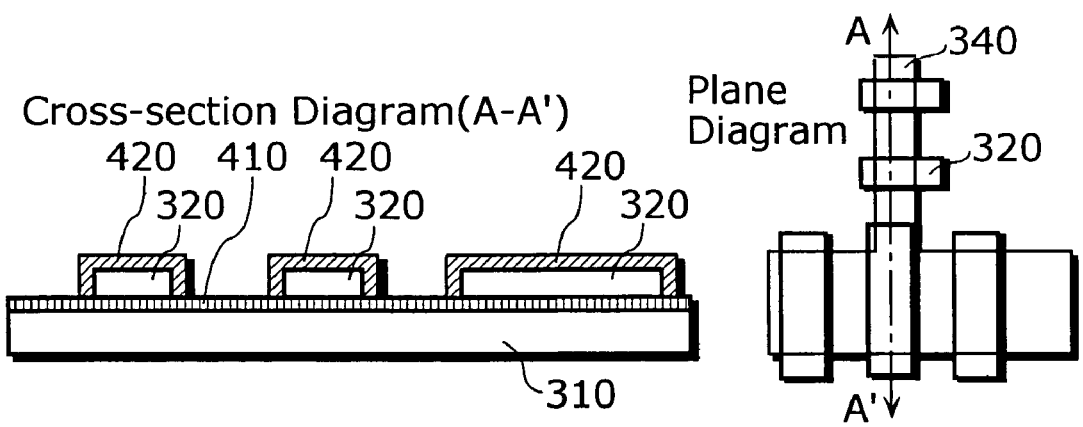
FIGS. 2A and 2B are schematic plane diagram indicating the arrangement of transfer electrodes in a conventional solid-state imaging apparatus and a schematic cross-section diagram at A-A' line in the schematic plane diagram.
Figure 2B:
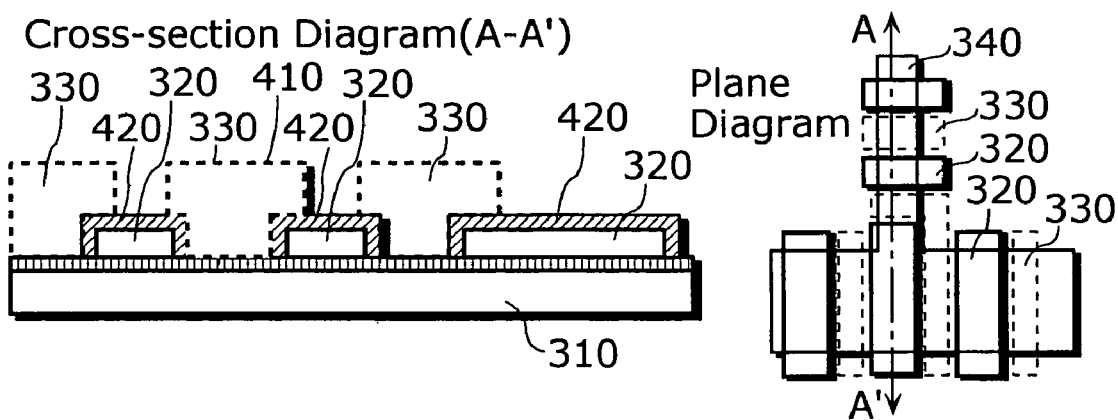
Figure 3:
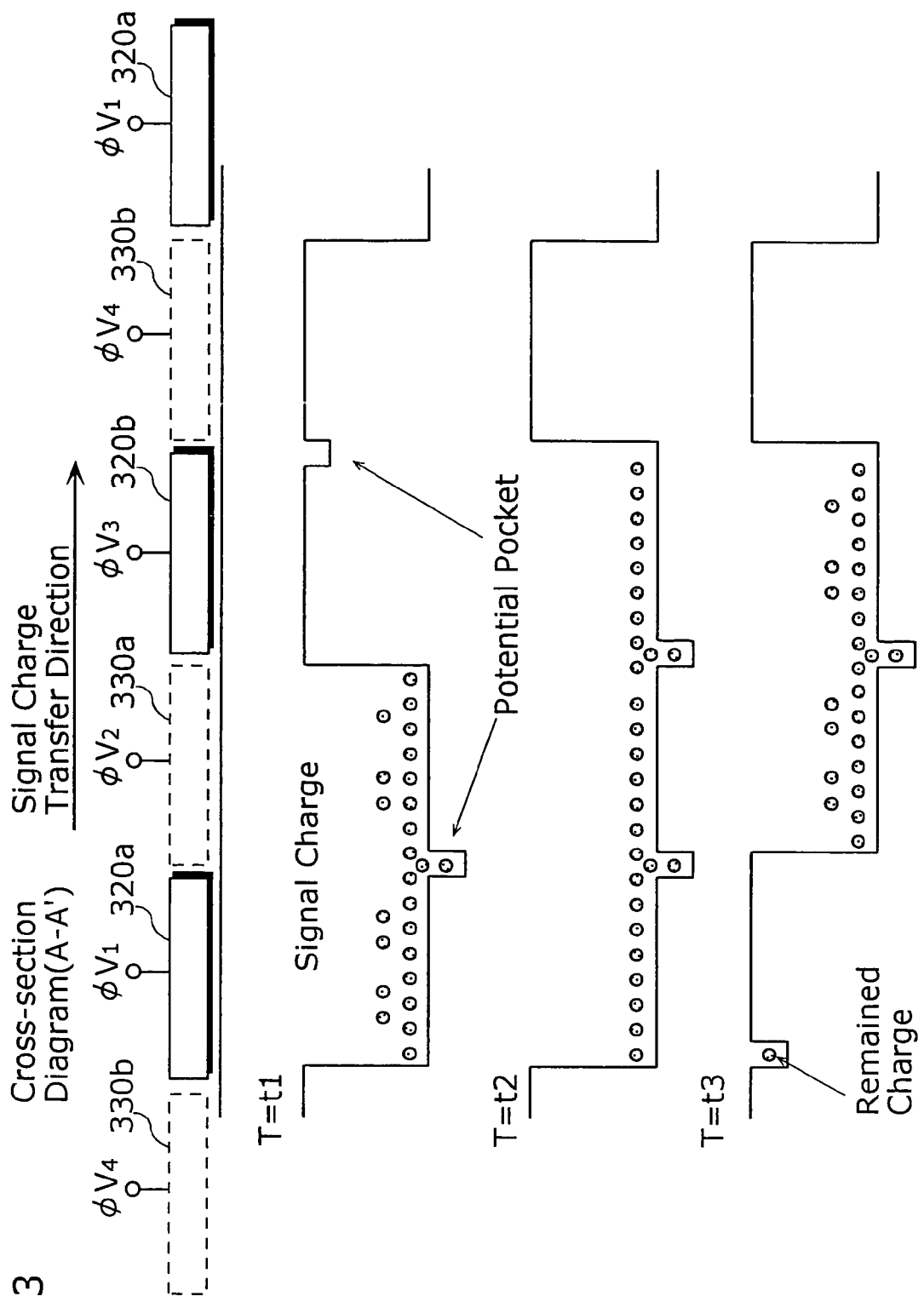
FIG. 3 is a change diagram of potential distribution for explaining transfer of signal charge.
Figure 4:
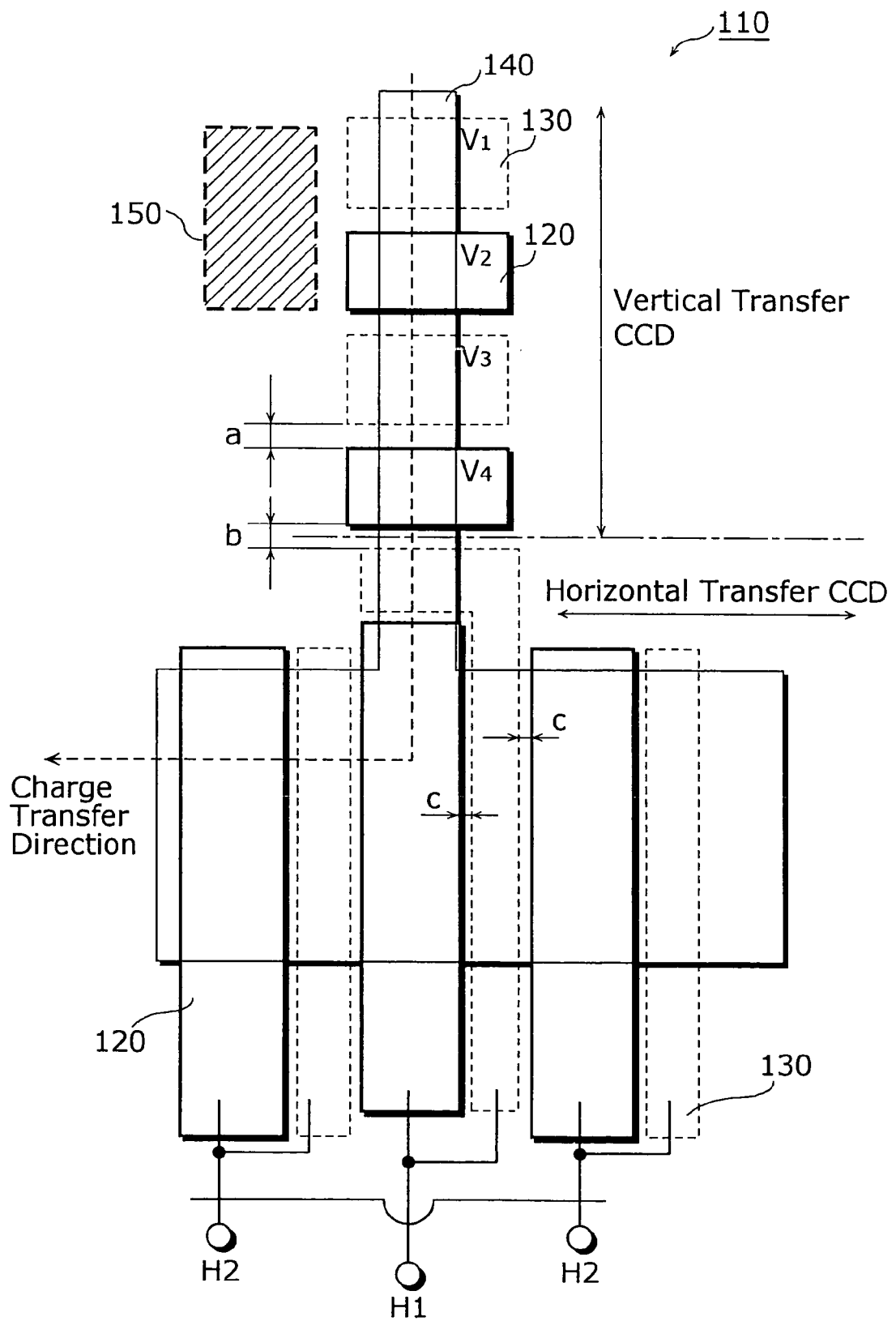
FIG. 4 is a schematic plane diagram indicating an arrangement of transfer electrodes according to the embodiment of the present invention.

FIG. 4 is a schematic plane diagram indicating an arrangement of transfer electrodes according to the embodiment of the present invention.

The solid-state imaging apparatus in the present embodiment aims to realize compatibility of high transfer efficiency in the horizontal transfer CCD with efficient breakdown voltage in the vertical transfer CCD, the solid-state imaging apparatus comprising a semiconductor substrate 110, a first layer poly-silicon electrode 120 and a second layer poly-silicon electrode 130 which form a two layered overlap poly-silicon electrode, a channel region 140 which is formed in a surface unit of the semiconductor substrate 110 and becomes a transfer path for signal charge, and a photodiode region 150 aligned photodiodes which convert light into signal charge and accumulate the signal charge. Here calls a distance between poly-silicon electrodes of vertical transfer CCD as a, a distance between a poly-silicon electrode of the vertical transfer CCD and a poly-silicon electrode of the horizontal transfer CCD as b, and a distance between poly-silicon electrodes of horizontal transfer CCD as c. The relationship between the inter-electrode distance a and the inter-electrode distance c is expressed by a following equation (1). The horizontal transfer CCD is a two-phase-driving CCD which transfers signal charge by applying voltage with two different levels of H1 and H2. The vertical transfer CCD is a four-phase-driving CCD which transfers signal charge by applying voltage with four different levels of V1, V2, V3 and V4.

$$a > c \qquad (1)$$

In the solid-state imaging apparatus with the structure described above, the vertical transfer CCD transfers signal charge in sequence outputted from the photodiode region 150 to the horizontal transfer CCD, the horizontal transfer CCD transfers the signal charge received from the vertical transfer CCD to an output unit (not shown in the diagram), and image signals are outputted.

Next, a manufacturing process for an arrangement of transfer electrodes in the solid-state imaging apparatus with the structure described above is explained with references to the schematic plane diagrams and the schematic cross-section diagrams (schematic cross-section diagrams at the A-A' line in the plane diagrams) as shown in FIGS. 5A, 5B, 5C, and 5D. In here, same components as in FIG. 4 are put with same marks as in FIG. 4, and the detail explanations about those components are omitted.

Firstly, as shown in FIG. 5A, first layer poly-silicon electrodes 120 are formed on a gate insulation film 210 of a semiconductor substrate 110 by the same method as the conventional technology. The first layer poly-silicon electrodes are oxidized so as to form first oxide films 220 and 230 for insulating between layers. Here, the first oxide film 220 is formed over each of the first layer poly-silicon electrodes 120 of the vertical transfer CCD and the first layer oxide film 230 is formed over each of the first layer poly-silicon electrodes 120 of the horizontal transfer CCD.

Secondly, as shown in FIG. 5B, the resist 240 is formed to cover all regions except the region where the first layer poly-silicon electrodes 120 of the horizontal transfer CCD are formed, that is, to cover the shaded area F in the plane diagram of FIG. 5B. After selectively removing the first oxide films 230 using fluoric acid solution, ion implantation using boron ions and the like is performed on the shaded area F' in the plane diagram of FIG. 5B to form potential barrier regions, the first oxide films 230 being formed over the first layer poly-silicon electrodes 120 of the horizontal transfer CCD. Here, the first oxide films 230 are selectively removed by wet etching using fluoric acid solution, the first oxide films 230 being formed over the first layer poly-silicon electrodes 120 of the horizontal transfer CCD. However, not only said wet etching but also other wet etching methods or methods other than wet etching such as dry etching method can be used if the first oxide films 230 formed over the first layer poly-silicon electrodes 120 of the horizontal transfer CCD are able to be selectively removed. Also, the resist 240 is formed to cover all regions except the region where the first layer poly-silicon electrodes 120 of the horizontal transfer CCD are formed. However, in addition to the first layer poly-silicon electrodes 120 of the horizontal transfer CCD, the resist 240 can be formed to cover all regions except a region where a part of the final step of the first layer poly-silicon electrodes 120 of the vertical transfer CCD is formed, t hat is the region of the part of first poly-silicon electrodes 120 of the vertical transfer CCD closest to the horizontal transfer CCD is formed. In this case, the inter-electrode distance b can be equal to the inter-electrode distance c.

Thirdly, as shown in FIG. 5C, once again the whole region is oxidized and second oxide films 250 are formed respectively over the first oxide films 220 and the first layer poly-silicon electrodes 120 of the horizontal transfer CCD.

Lastly, as shown in FIG. 5D, second layer poly-silicon electrodes 130 are formed between the first layer poly-silicon electrodes 120.

In the solid-state imaging apparatus manufactured by the above mentioned method, the thickness of the second oxide film 250 formed over the first layer poly-silicon electrode 120 of the horizontal transfer CCD is thinner than the thickness of the oxide film formed over the first layer poly-silicon electrode 120 of the vertical transfer CCD. That is, it is thinner than the total thickness of the first oxide film 220 and the second oxide film 250. Therefore, the distance between electrodes of horizontal transfer CCD becomes shorter than that of vertical transfer CCD.

As above described, according to the present embodiment, it becomes possible to make the distance between electrodes of the horizontal transfer CCD short and the distance between electrodes of the vertical transfer CCD long. As the result, the solid-state imaging apparatus of the present embodiment can realize high transfer efficiency in the horizontal transfer CCD and efficient breakdown voltage in the vertical transfer CCD. That is, potential pockets formed under inter-transfer-electrodes in the horizontal transfer CCD is made smaller and signal charge in the horizontal transfer CCD is transferred at high speed. Additionally, the amount of electric consumption is reduced since the solid-state imaging apparatus can obtain efficient transfer efficiency with low driving voltage.

Also, according to the present embodiment, the vertical transfer CCD and the horizontal transfer CCD can be formed by the same process without forming them separately.

According to the present embodiment, the inter-electrode distance in the horizontal transfer CCD is short. Therefore, the solid-state imaging apparatus of the present embodiment does not need to extend the region of horizontal transfer CCD to increase the maximum amount of signal charge to be transferred in the horizontal transfer CCD and enable to increase the saturation threshold of the amount of signal charge without extending the region of horizontal transfer CCD.

Further, according to the present embodiment, the inter-electrode distance b and the inter-electrode distance c can be equalized. Therefore, the inter-electrode distance b becomes shorter than the inter-electrode distance a; the transfer efficiency of the signal charge between the poly-silicon electrodes of the vertical transfer CCD and the poly-silicon electrodes of the horizontal transfer CCD can be improved; and a solid-state imaging apparatus of the present embodiment can control FPN (Fixed Pattern Noise) between the poly-silicon electrodes CCD of the vertical transfer CCD and the poly-silicon electrodes CCD of the horizontal transfer CCD.

According to the present embodiment, the inter-electrode distance in the vertical transfer CCD is determined by a total thickness of the first oxide film 220 and the second oxide film 250, and the inter-electrode distance in the horizontal transfer CCD is determined by the second oxide film 250. Therefore, the solid-state imaging apparatus of the present embodiment can control the inter-electrode distance in the vertical transfer CCD and the inter-electrode distance in the horizontal transfer CCD separately, by controlling a thickness of each oxide film, and set the inter-electrode distances in the vertical transfer CCD and the horizontal transfer CCD with a high degree of flexibility.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

For example, in the present embodiment, the poly-silicon electrodes are formed in a two layered overlap poly-silicon structure. However, the poly-silicon electrodes can be formed in a structure having three or more layers.

Also, in the present embodiment, the horizontal transfer CCD is a two-phase-driving CCD and the vertical transfer CCD is a four-phase-driving CCD. However, the horizontal transfer CCD can be other driving methods such as four-phase-driving method, and the vertical transfer CCD can be other driving methods such as two-phase-driving.

Furthermore, in the present embodiment, oxide films formed between the first layer poly-silicon electrode 120 and the second layer poly-silicon electrode 130 are formed by two-layer films in the vertical transfer CCD and by one-layer film in the horizontal transfer CCD. However, if the distance between transfer electrodes in the horizontal transfer CCD is shorter than the distance between transfer electrodes in the vertical transfer CCD, the oxide film of the vertical transfer CCD can be formed by two or more layered films and the oxide films of the horizontal transfer can be formed by one or more layered films.

What is claimed is:

1. A manufacturing method of a solid-state imaging apparatus, comprising:
    a step of forming first transfer electrodes of a vertical transfer CCD and a horizontal transfer CCD on a semiconductor substrate;
    a step of forming first oxide films over each of the first transfer electrodes;
    a step of opening a region that includes only the first transfer electrodes of the horizontal transfer CCD and forming a resist layer which covers all other regions;
    a step of selectively removing the first oxide films formed over the first transfer electrodes of the horizontal transfer CCD;
    a step of forming a potential barrier region by implanting ions between the first transfer electrodes of the horizontal transfer CCD;
    a step of removing said resist layer;
    a step of forming a second oxide film over each of the first transfer electrodes of the vertical transfer CCD and the horizontal transfer CCD; and
    a step of forming second transfer electrodes between the first transfer electrodes of the vertical transfer CCD and the horizontal transfer CCD.

2. The manufacturing method of the solid-state imaging apparatus according to claim 1,
    wherein the first oxide films are removed by wet etching.

3. A manufacturing method of a solid-state imaging apparatus, comprising:
    a step of forming first transfer electrodes of a vertical transfer CCD and a horizontal transfer CCD on a semiconductor substrate;
    a step of forming a first oxide film over each of the first transfer electrodes;
    a step of opening a region that includes the first transfer electrodes of the horizontal transfer CCD and a part of the horizontal transfer CCD side at a final step of the first transfer electrodes of the vertical transfer CCD and forming a resist layer which covers all other regions;
    a step of selectively removing the first oxide films formed over the first transfer electrodes of the horizontal transfer CCD and the part of the horizontal transfer CCD side at the final step of the first transfer electrodes of the vertical transfer CCD;
    a step of forming a potential barrier region by implanting ions between the first transfer electrodes of the horizontal transfer CCD and between the final step of the first transfer electrodes of the vertical transfer CCD and the first transfer electrode of the horizontal transfer CCD;
    a step of removing said resist layer;
    a step of forming a second oxide film over each of the first transfer electrodes of the vertical transfer CCD and the horizontal transfer CCD; and
    a step of forming second transfer electrodes between the first transfer electrodes of the vertical transfer CCD and the horizontal transfer CCD.

* * * * *